(12) United States Patent
Yazawa et al.

(10) Patent No.: US 6,601,390 B1
(45) Date of Patent: Aug. 5, 2003

(54) METHOD AND APPARATUS FOR CONVERTING DISSIPATED HEAT TO WORK ENERGY

(75) Inventors: Kazuaki Yazawa, Chiba (JP); Avram Bar-Cohen, St. Louis Park, MN (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/068,632

(22) Filed: Feb. 5, 2002

(51) Int. Cl.[7] ............................................... F01K 25/02
(52) U.S. Cl. ........................................ 60/650; 60/645
(58) Field of Search ........................ 60/643, 670, 645, 60/650

(56) References Cited

U.S. PATENT DOCUMENTS

| | | | | |
|---|---|---|---|---|
| 5,458,189 A | * | 10/1995 | Larson et al. | 165/104.27 |
| 5,587,880 A | * | 12/1996 | Phillips et al. | 165/104.29 |
| 5,704,416 A | * | 1/1998 | Larson et al. | 165/104.21 |
| 6,243,269 B1 | * | 6/2001 | Dibene et al. | 174/15.2 |

* cited by examiner

Primary Examiner—Hoang Nguyen
(74) Attorney, Agent, or Firm—Sonnenschein, Nath & Rosenthal

(57) ABSTRACT

A method for enhancing natural convection and for converting lower temperature dissipated heat to other useful energy and apparatus therefor. Heat energy is transferred to a medium contained with a channel, and natural convection of the medium is utilized to transfer kinetic energy to another type of energy such as electrical energy.

32 Claims, 6 Drawing Sheets

METHOD AND APPARATUS FOR CONVERTING DISSIPATED HEAT TO WORK ENERGY

BACKGROUND OF THE INVENTION

The present invention generally relates to methods and apparatuses for converting heat energy into other forms of energy. In addition, the invention relates to methods and other accommodations for dissipating heat away from devices generating heat.

Generally, the Second Law of Thermodynamics states that heat will travel from a hotter medium to a cooler medium. Further, as is known, hot air rises as the heated air expands and seeks to migrate to a lower pressure area, thereby creating what is known as natural convection. This process is commonly referred as the "chimney effect."

Since the thermodynamic "availability," or energy content, of a solid or fluid increases strongly with absolute temperature, efficient electric power generation from a heat source is usually performed at elevated temperatures, often in the range of 600° C.–800° C. In the categories of high temperature conversion, these systems are generally large, with each generator unit producing megawatts of electric power and occupying a volume of 10 $m^3$ to 100 $m^3$. Alternatively, lower temperature equipment operating between 100° C. and 200° C., have been developed to recover energy from solar-concentrator heated fluids and geothermal sources and waste heat rejected by high temperature conversion systems.

In the marketplace, many products generate heat in the low temperature range below 150° C. For example, electrical components, such as integrated circuits including a central processor unit (CPU) for a computer and operating in close proximity in an enclosed electronic apparatus, produce heat. To prevent thermal failure of one of the electrical components in the enclosed electronic apparatus this heat needs to be dissipated. These enclosed electronic apparatuses are common and typically include personal computers, laptop computers, display monitors, computer peripherals, television sets, projectors, projection monitors, handheld personal digital assistants (PDAs), cellular phones, facsimile machines, video cassette recorders (VCRs), digital versatile disc (DVD) players, audio systems and similar equipment. Further, slightly larger equipment, such as refrigerators, washers, dryers and other similar appliances also may generate heat in this low temperature range.

Thermal management of the electronic components in the enclosed electronic apparatus is necessary to prevent the enclosed electronic apparatus from failing or to extend the useful life of the enclosed electronic apparatus. For instance, a typical CPU operating in a personal computer may operate at a maximum temperature of 70° C. without experiencing a thermal failure; but due to the heat generated by a typical CPU, however, the temperature often reaches 100° C. and above which could lead to thermal failure.

SUMMARY OF THE INVENTION

The present invention provides systems, methods and apparatus for applying the "chimney effect" to enhance natural convection cooling of an electrical component.

The present invention provides systems, methods and apparatus for dissipating heat emitted by an electrical component and for dissipating the heat out of an electrical device.

The present invention provides systems, methods and apparatus for converting relatively low temperature waste heat into other useful forms of energy. The invention is especially useful for generating electrical energy from relatively low temperature heat.

In an embodiment, the present invention provides that relatively lower temperature heat energy is transferred to a fluid medium in a channel and that natural convection of the fluid medium is utilized to generate another useful energy, preferably electricity. As used herein, a "fluid medium" unless otherwise noted is included to mean any flowable medium such as gas or liquid.

In an embodiment, the present invention provides an improved heat dissipater and method for using same in which dissipated heat is converted to work energy. Heat generated by electrical components is dissipated via a channel internally housed within an enclosure.

In an embodiment, the channel can have an inlet and an outlet and a nozzle section for generating an increased flow portion within the channel.

In an embodiment, a plurality of such channels are provided with each channel sized and shaped for paralleably extending across the electrical device.

In an embodiment, the present invention provides a plurality of heat transfer members which are adjacently disposed to a plurality of electrical components where each electrical component generates heat. Each heat transfer member thermally connects each electrical component to the channel wall for maintaining a temperature differential between the electrical component and the channel. This temperature differential generates fluid medium flow by natural convection through the channel to the outlet and out of an enclosure.

In an embodiment, to direct the heated air flow from a plurality of such channels, a manifold is provided which thermally connects to each outlet for combining the heated flow of fluid medium of each outlet and directing the heated air flow out of the enclosure.

Further, in an embodiment, the invention provides an energy converter that harnesses the heated fluid medium flow. The energy converter may have a turbine mounted at the outlet of the channel. Alternatively, the turbine can be mounted in any other appropriate portion of the channel, one example of which is a nozzle section of the channel mentioned above. The energy converter is connected to an electrical storage for transferring power generated by the turbine to an external load.

In an embodiment, for increased air flow out of the enclosure, the invention provides for an extendable channel that is removably fixed to the channel. This extendable channel can be caused to extend either manually or by a suitable automatic mechanism.

The present invention also provides for methods of using such heat dissipating devices. In that regard, the method in accordance with one aspect of the invention comprises the steps of conducting heat away from an electronic component into a channel and transferring the conducted heat to a fluid medium disposed within the channel.

Next, the method provides creating a natural convection fluid flow effect in the fluid medium by virtue of the transfer of heat. Further, the energy is harnessed by the fluid medium flow to generate another form of energy. In one method, the form of energy is electrical energy.

In one method, the step of harnessing the energy provided by the fluid flow comprises the step of using the fluid medium flow to drive a turbine connected to an energy converter.

The present invention has many advantages. These advantages relate to an enhanced cooling of an electrical component and generating power from the heat given off by the electrical component.

An advantage of the invention is the ability to transfer the heat given off from the electrical component to a fluid medium, which in turn is subject to flow due to natural convection caused by transfer of heat to the fluid medium.

Another advantage of the invention is the ability to derive electricity from the natural convection and to supply the electricity to an electrical storage without requiring additional energy.

These and other advantages and aspects of the present invention are set forth in greater detail in the following detailed description of the presently preferred embodiments with reference to the attached drawings.

DETAILED DESCRIPTION OF THE PRESENTLY PREFERRED EMBODIMENTS

As discussed above, there is provided an apparatus and method for efficiently transferring unconverted or remaining waste heat away from a heat source, such as an electrical component. The present invention also provides for converting waste heat from the heat source into other forms of energy such as work energy.

The present invention is directed to converting waste heat for energy conversion in a 75° C.–150° C. temperature range into other useful energy. As mentioned above and described more fully below, in accordance with principles of the invention, power is derived from waste heat via an energy converter producing approximately 1W–10W yet only occupying several $cm^3$ of volume. Thus, the present invention can generate power derived from the waste heat for output for operating other devices for cooling purposes (such as a fan or a miniature refrigerator), extending battery life, re-charging depleted batteries, and reducing the electricity demand on the power grid in the office or home.

Figure 1:
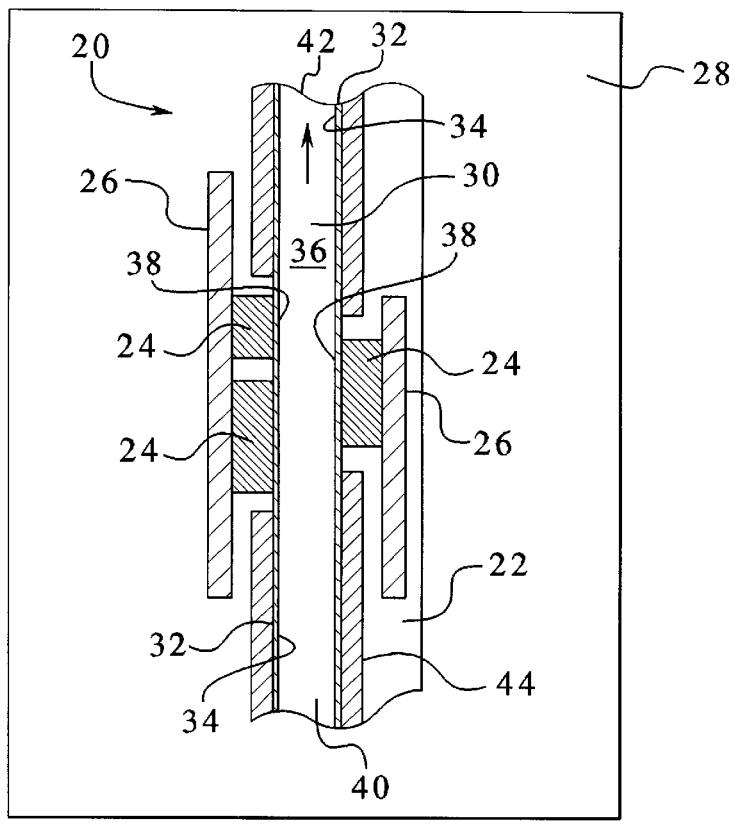
FIG. 1 illustrates in cross section a first heat dissipating device or arrangement embodying principles of the invention.

FIG. 1 illustrates a cross section view of an exemplary heat dissipating device or arrangement 20 to convert heat energy or waste heat into work energy in accordance with general principles of the invention. In FIG. 1, the heat dissipating device 20 is thermally connected to an electrical component 22 of an electrical device 24.

The electrical component 22 may be one of a plurality of electrical components 22 that are part of the electrical device 24. Electrical components 22 may be any device that gives off heat when operating or when power is supplied to the electrical components 22. Electrical components 22 may be heat sources that emit heat up to a temperature of 150° C. before thermal breakdown. As illustrated in FIG. 1, the electrical device 24 also includes a circuit board 26 that supports and provides electrical interconnections between the electrical components 22. The electrical device 24 may also include an enclosure 28 or housing that substantially surrounds the circuit board 26 and the electrical components 22. The heat emitted by the electrical components 22 must be dissipated outside the enclosure 28 to prevent thermal breakdown. The present invention prohibits the enclosure 28 from retaining or inhibiting heat generated by the electrical components 22 from being transferred out of the electrical device 24.

As shown in FIG. 1, the heat dissipating device 20 includes a channel 30 that has an exterior 32 adapted to receive heat and an interior 34 adapted to dissipate heat. The heat dissipating device 20 also includes a fluid medium 36 that substantially fills the channel 30 and which is thermally convective. The fluid medium 36 is preferably non-corrosive to the channel 30. Further, the fluid medium 36 may be a gas with the gas commonly being air. The channel 30 further has a portion 38 that is effective to conduct thermal energy. The portion 38 can occupy that part or parts of the channel where the exterior 32 meets the electrical component 22. Thus, the portion 38 can occupy one side of the channel 30 or can occupy opposed sides of the channel 30 as shown in FIG. 1.

Essentially, the portion 38 acts as a heat sink. In FIG. 1, various electrical components 22 are in thermal contact with the portion 38, to enable transfer of heat from the electrical components 22 to the portion 38. There may or may not be a thermally conductive intermediary such as a thermally conductive adhesive between the components 22 and the portion 38. The components 22 may be mounted on circuit boards by means known to those in the art. Thus, the channel 30 dissipates heat emitted by one or more of the electrical components 22.

As shown in FIG. 1, the channel 30 has an inlet 40 an outlet 42. The inlet 40 draws in the fluid medium 36 disposed within the enclosure 28 or external to the enclosure while the outlet 42 exits the fluid medium 36 out of the enclosure 28. In general, the heat dissipating device 20 receives heat energy emitted from the electrical component 22 through the exterior 32. When receiving the heat energy, the exterior 32 has a first temperature that may be as high as 150° C. while the interior 34 of the channel 30 has a second temperature that may be at ambient temperature. As known to one skilled in the art, the heat transfer from the exterior 32 into the interior 34 causes a temperature and pressure gradient which forces the fluid medium 36 to move within the channel 30. Essentially, the channel 30, acts as a small chimney in the sense that the now hot fluid medium 36 is caused/allowed to flow upwardly therethrough and out of an outlet 42 of the channel 30. In FIG. 1, it is also illustrated that the heat dissipating device 20 may include an insulation layer 44 surrounding the channel 30 to insulate the channel 30 to prevent heat loss out of the channel 30 resulting in increased efficiency.

As stated before, a thermally conductive adhesive connecting the electrical component 22 to the channel 30 may be used.

Figure 2:
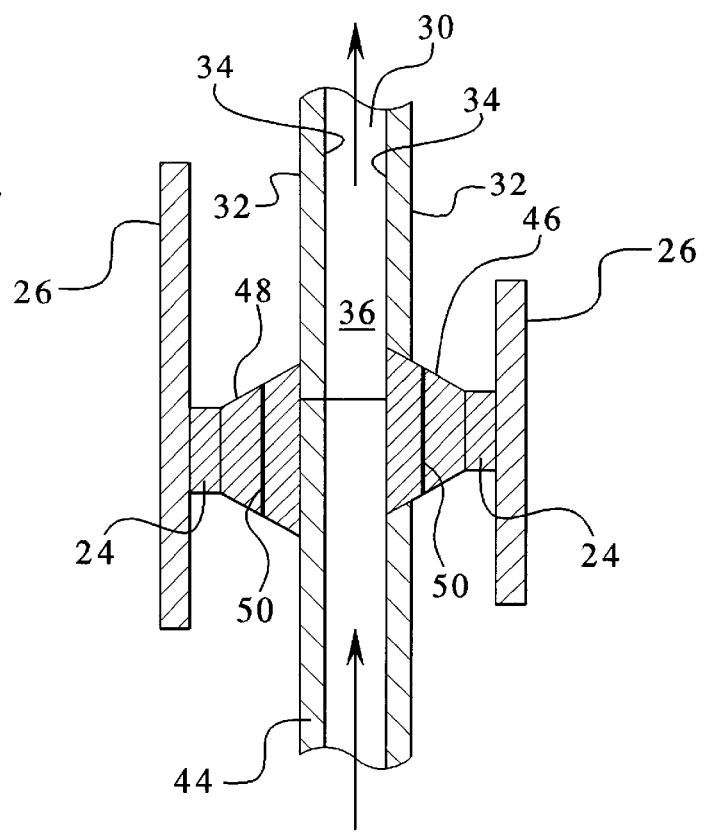
FIG. 2 illustrates in cross section a second heat dissipating device or arrangement embodying principles of the invention.

Turning to FIG. 2, in order to efficiently dissipate the heat, a heat transfer member 46 may be used. FIG. 2 depicts an embodiment where a heat transfer member 46 is disposed adjacent to each electrical component 22. The heat transfer member 46 comprises a thermal conductor 48, which may include a tapered cross section, which is conductably attached to the electrical component 22. The thermal conductor 48 is further attached to the exterior 32 as shown in FIG. 2. The thermal conductor 48 thus maintains a temperature differential between the electrical component 22 and the exterior 32 as the heat travels from the electrical component 22 to the exterior 32 and into the interior 34 to heat the fluid medium 36.

To reduce thermal resistance, highly thermal conductive material is used as the thermal conductor 48. It should be noted that the highly thermal conductive material can include those materials in the art, such as, but is not limited to, copper or aluminum. To further reduce contact resistance among the electrical components 22, the thermal conductor 48 and the exterior 32, interfacial material or a thermal conductive gel 50, such as, but not limited to, a silicone based aluminum powder compound, is applied around the thermal conductor 48 as shown in FIG. 2.

Accordingly, the thermal resistance between the electrical component 22 and the channel 30 is smaller then any other heat path out from the electrical component 22. To thermally insulate the channel 30, the channel 30 is designed with low thermal conductivity materials such as Polystyrene and Acrylonitryl-Butadiene-Styrene. In addition, for more effective insulation, the insulation layer 44 is coated with a thin metal layer, which has low surface emissivity (below 0.01), on the outside surface of the exterior 32 as shown in FIG. 2 to reduce the heat loss. Thus, in a typical environment, the electrical component 22 is soldered at a first end to the circuit board 26 while attaching a second end to the thermal conductor 48. Thus, to concentrate heat to the exterior 32, the thermal resistance between the electrical component 22 and the channel 30 is less than any other heat path to the circuit board 26 or enclosure 28.

As the heat dissipating device 20 is capable of being applied to a variety of electrical devices, the channel 30 is also configured to the variety of electrical devices. The channel 30 is extended through the enclosure 28 in a path of least resistance as the channel 30 is formed as straight as possibly allowed within the internal makeup of the electronics of the electrical device 24. Thus, the channel 30 is capable of being bent or made to curve, although the most efficient design results in the straightest channel 30. Further, each channel 30 does not contain any ports or branches.

Figure 3:
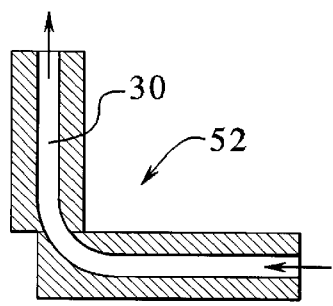
FIG. 3 illustrates in cross section a channel embodying principles of the invention.

Accordingly, as shown in FIG. 3, the channel 30 is shown for use in a vertical configuration found in such devices as, but not limited to, a desktop computer. Accordingly, the channel 30 is configured in an upright form generally shown as 52.

Figure 4:
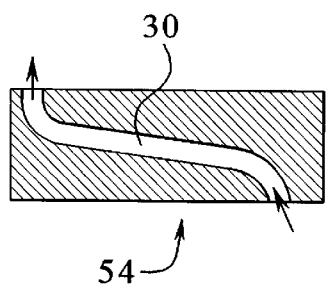
FIG. 4 illustrates in cross section another channel embodying principles of the invention.

Turning to FIG. 4, the channel 30 is shown for use in a curved configuration found in such devices as, but not limited to, a video cassette recorder. Accordingly, the channel 30 is configured in a curved form generally shown as 54.

Figure 5:
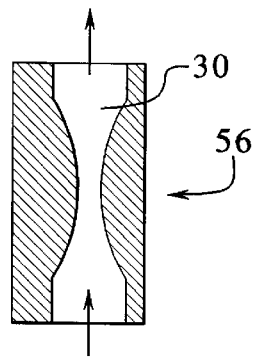
FIG. 5 illustrates in cross section yet another channel embodying principles of the invention.

Turning to FIG. 5, the channel is shown for use in a thin configuration found in such devices as, but not limited to, a cellular phone. Accordingly, the channel 30 is configured in a nozzle form generally shown as 56.

Figure 6:
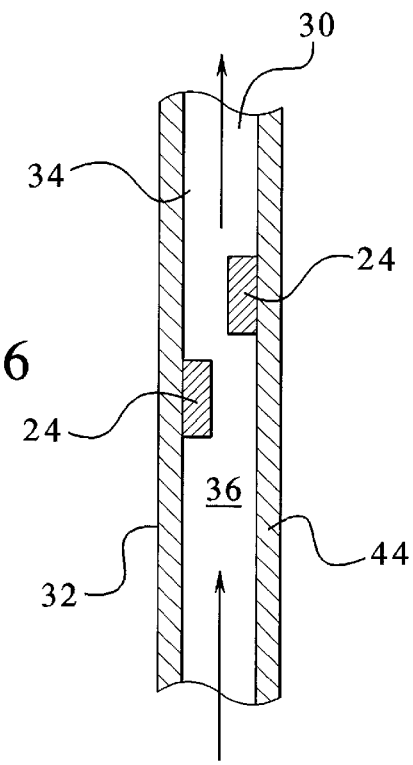
FIG. 6 illustrates in cross section a third heat dissipating device or arrangement embodying principles of the invention.

FIG. 6 depicts a cross section view of one embodiment of the heat dissipating device 20 that dissipates heat emitted by the electrical component 22. Instead of applying the thermal conductor 48 in this embodiment, the channel 30 is attached around the electrical component 22. Thus, the sides and top of the electrical component 22 are physically inside in the channel 30 and connected to the interior 34 as shown in FIG. 6. In this embodiment, at least one electrical component 22 may be positioned within the channel 30. Accordingly, heat generated by the electrical component 22 emits directly into the channel 30 to cause the natural convection of the fluid medium 36.

Figure 7:
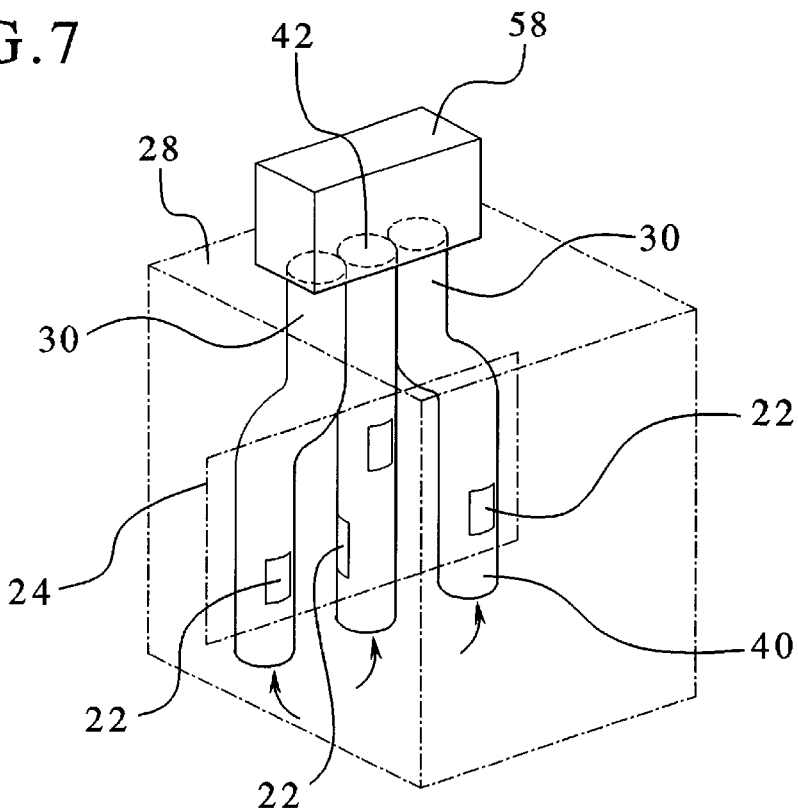
FIG. 7 illustrates in perspective form a fourth heat dissipating device or arrangement embodying principles of the invention.

As the layout of the electrical components 22 is dependent on, among other criteria, the configuration and size of the enclosure 28, additional channels 30 may be needed to thermally connect to all the electrical components 22. Accordingly, an alternate embodiment is shown in FIG. 7 in which three channels 30 are illustrated in parallel arrangement. Since the electrical component 22 layout is based on the electrical connection, or the space limitation of the enclosure 28, it is possible to design a plurality of channels 30 in one enclosure 28. Thus, in these configurations, each channel 30 can be designed, either independently or in parallel. The channels 30 are shown placed within an enclosure 28, which can be, by way of one example only, a computer cabinet where at the outlet ends of the channels 30 is a common final channel or manifold 58. Accordingly, the manifold 58 is thermally connected to each outlet 42 of the plurality of channels 30 to combine the heated air flow of the channels 34 to dissipate heat outside the enclosure 28.

Figure 8:
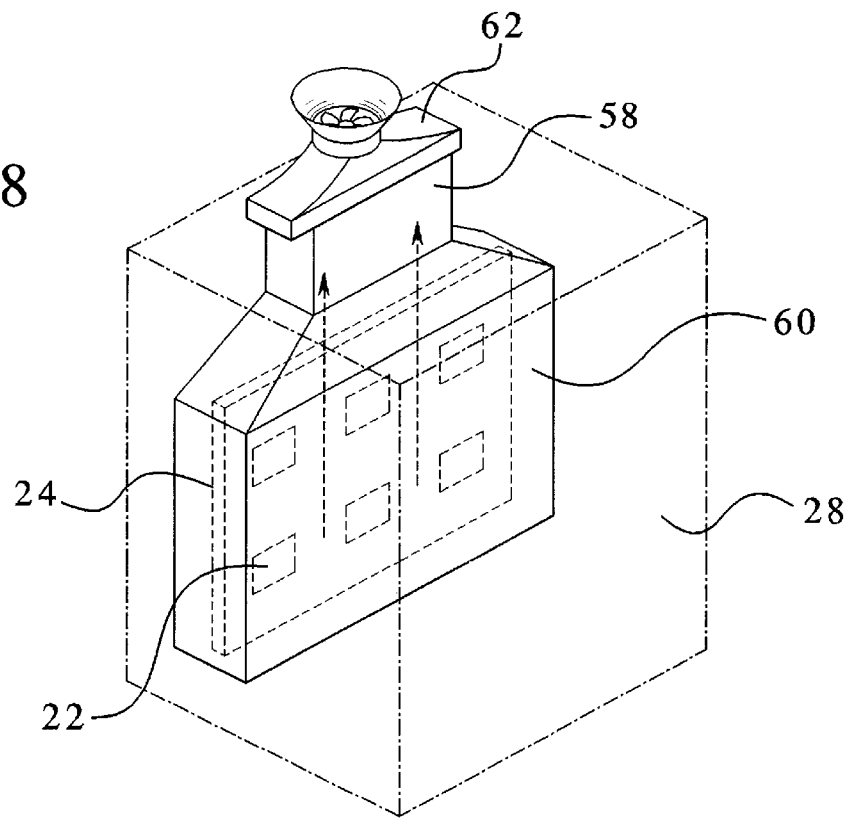
FIG. 8 illustrates in perspective form a fifth heat dissipating device or arrangement embodying principles of the inventions.

FIG. 8 depicts in perspective view another embodiment of the invention employing other principles of the invention. As illustrated, the electrical components 22 are in a thermally conductive association with a common channel 60. The common channel 60 may terminate in the manifold 58 outside of the enclosure 28. Alternatively, the common channel 60 may terminate outside the enclosure 28 without the manifold 58. As the common channel 60 encompasses the electrical component 22, the circuit board 26 itself is exposed to the inside of the common channel 60.

Figure 9:
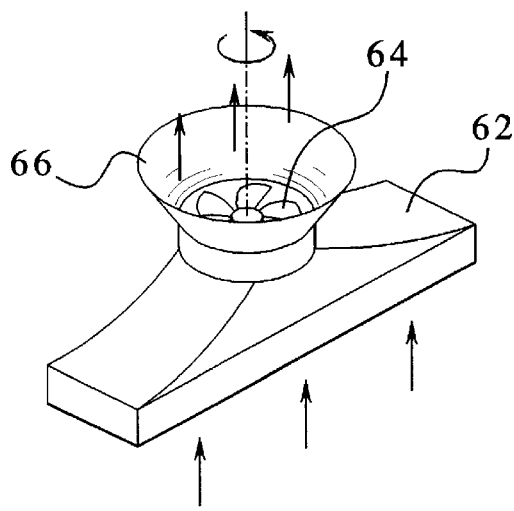
FIG. 9 illustrates in perspective form a first turbine device.
Figure 10:
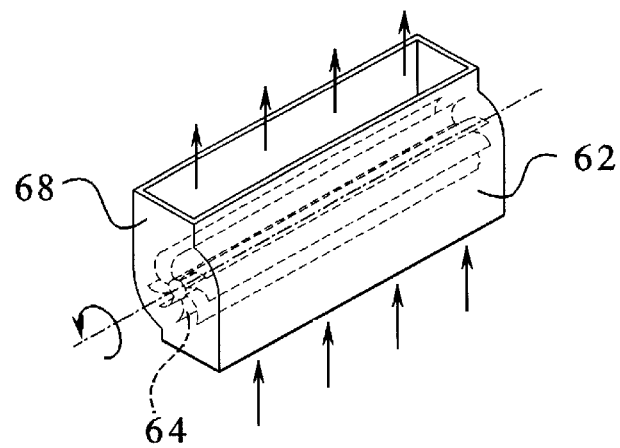
FIG. 10 illustrates in perspective form a second turbine device.

In order to generate electricity of the fluid medium 36, an energy converter 62 such as a generator may be mounted to the channel 30 as shown in FIG. 8. Referring to FIG. 3, the energy converter 62 may also be mounted to the manifold 58. Referring to FIGS. 9 and 10, the energy converter 62 may use a turbine 64 which is designed to fit in the cross section of the channel 30 to connect to the outlet 42 (shown in FIG. 1). Alternatively, the energy converter 62 may be positioned within the channel 30 where the fluid medium 36 movement may be greatest as in the nozzle configuration 56 as shown in FIG. 5. Since the airflow velocity is extremely low, the turbine 64 is optimized for the balance between flow resistance and rotational energy gain. The turbines 64 are directly connected to the energy converter 62 so that the kinetic energy is converted to an electric current flowing in a circuit with a proper load as commonly known in the art.

As shown in FIGS. 9 and 10, the turbine 64 has different embodiments depending on the configuration of the enclosure 28. For example, the turbine 64 may incorporate a round turbine 64 as shown in FIG. 9. If the outlet 42 is narrow, then a round turbine 64 would be used. However, if the outlet 42 is long, a column turbine 64 would be used as shown in FIG. 10.

Figure 11:
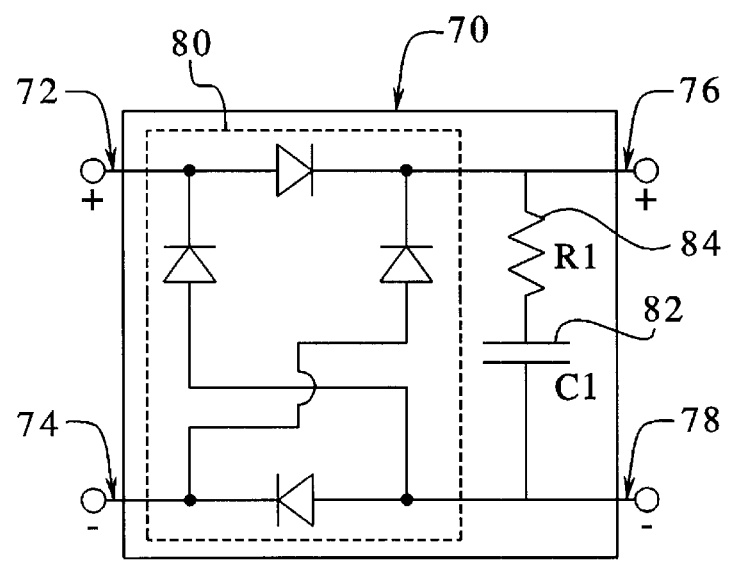
FIG. 11 illustrates a schematic form of an electrical storage device embodying principles of the invention.

Turning to FIG. 11, the electrical device 24 may also include an electrical storage 70, such as a capacitor or battery, that is adapted to store an electrical charge. The heat dissipating device 20 may transfer the work energy in the form of electricity to the electrical storage 70. The electrical storage 70 may be operably connected to a load device (not shown) to provide power to the load device. The load device is preferably a box fan or other cooling apparatus that would utilize the power from the electrical storage 70 to further dissipate heat out of the electrical device 24.

Referring to FIG. 11, the electrical storage 70 is shown in schematic form. The electrical storage 70 has a positive input 72 and a negative input 74 that are each electrically connected to a respective positive and negative electrode (not shown) of the energy converter 62. The electrical storage 70 receives and stores the voltage from the energy converter 62. The electrical storage 70 also has a first and a second output 76 and 86 that can be connected to the load device to provide power to the load device.

The electrical storage 70 may include a standard full-wave rectifier 80 and a capacitor 82 that is electrically connected to the full-wave rectifier 80. The full-wave rectifier 80 converts the asynchronous current received from the energy converter 62 to a D.C. voltage that is stored in the capacitor 82. The electrical storage 70 also includes a resistor 84 that controls the current flow to the load device that may be connected to the first and second outputs 86 and 86 of the electrical storage 70. It is contemplated that the electrical storage 70 may include any means known in the art for receiving an alternating current, transforming the alternating current to a direct current, and storing the voltage transported by the direct current. Thus, the energy converter 62 converts the kinetic energy of the fluid medium 36 to energy, preferably electrical energy, which can be stored in the electrical storage 70.

As the channels 30 are limited by the dimensions of the enclosure 28, the required performance heat transport may not be met. Accordingly, additional heated flow of the fluid medium 36 may be needed. FIGS. 12–16 depict alternative embodiments where extending the channel 30 outside the enclosure 28 allows increased heat transfer fiom the electrical component 22. Accordingly, an extendable channel 86 which may be thermally insulated may be used outside of the enclosure 28 as shown in FIGS. 12–16.

Thus the extendable in channel 86 is provided to extend the heat flow. This extendable channel 86 has a stopper (not shown) to stop the extendable channel 86 at the proper extended position. The extendable channel 86 can be mechanically actuated by raisin a handle (not shown). The handle which pushes or pulls to extend or retract the extendable channel 86 is optional for easy hand operation.

In addition, the extendable channel 86 can be operated by a means for automatically extending 88 the extendable channel 86. In one embodiment, the means for automatically extending 88 may include a motor. However, it should be noted that the means for automatically extending 88 can also include those means known in the art and can further include, such as, but not limited to, a piezo electric actuator, a shaped memory actuator and a thermostat. Accordingly, the means for extending 88 is meant to include not only the structures described herein, but also, any acts or materials described herein, and also include any equivalent structures, equivalent acts, or equivalent materials to those described herein. The automatic means 88 may be controlled by a temperature sensing means (not shown) to extend the extendable channel 86 when the temperature of the temperature sensing means exceeds the proper threshold and extract the extendable channel 86 when the temperature of the temperature sensing means registers below the proper threshold. Thus, the extendable channel 86 can be automatically operated based on the temperature of the electrical components 22.

Figure 12:
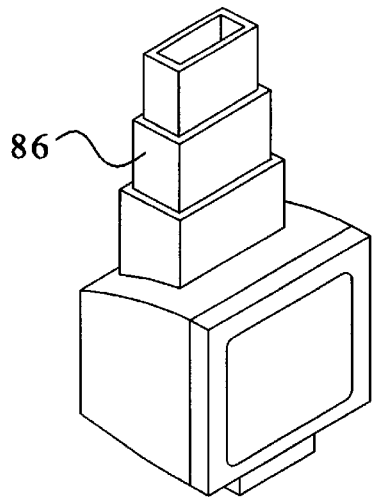
FIG. 12 illustrates in perspective form a cathode ray tube embodying principles of the invention.
Figure 13:
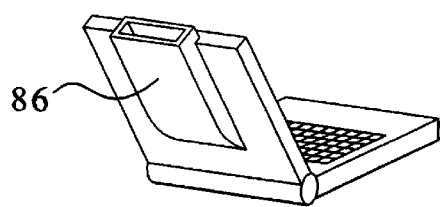
FIG. 13 illustrates in perspective form a device representative of a cellular telephone or a laptop computer embodying principles of the invention in a first state.
Figure 14:
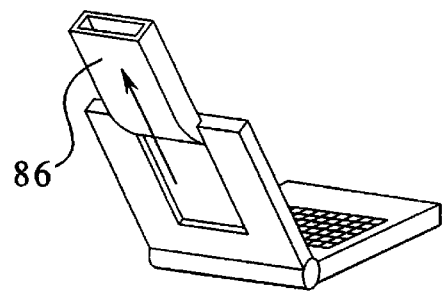
FIG. 14 illustrates in perspective form the device of FIG. 13 in a second state.
Figure 15:
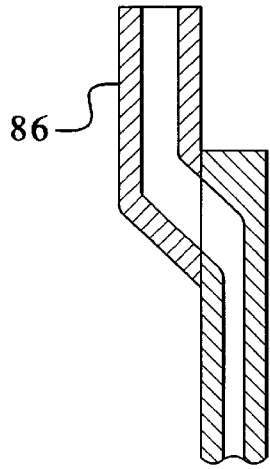
FIG. 15 illustrates in cross section a channel member of the cathode ray tube of FIG. 11 embodying principles of the invention in a general state.
Figure 16:
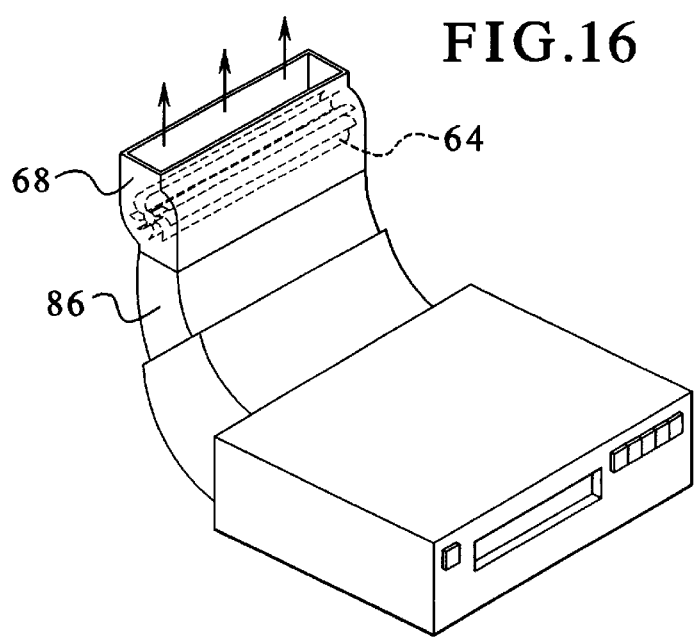
FIG. 16 illustrates in perspective form an electric device, such as a video tape recorder, embodying principles of the invention.

FIG. 12 illustrates the extendable channel 86 connected to a monitor such as a computer monitor in the extended position. FIGS. 13 and 14 illustrate the extendable channel 86 connected to a cellular phone or laptop computer in the unextended and extended positions respectively. FIG. 15 illustrates the extendable channel 86 in cross section. FIG. 16 illustrates the extendable channel 86 connected to a video cassette recorder. FIG. 16 also illustrates the energy converter 62 utilizing the column turbine 64 connected to the extendable channel 86.

Figure 17:
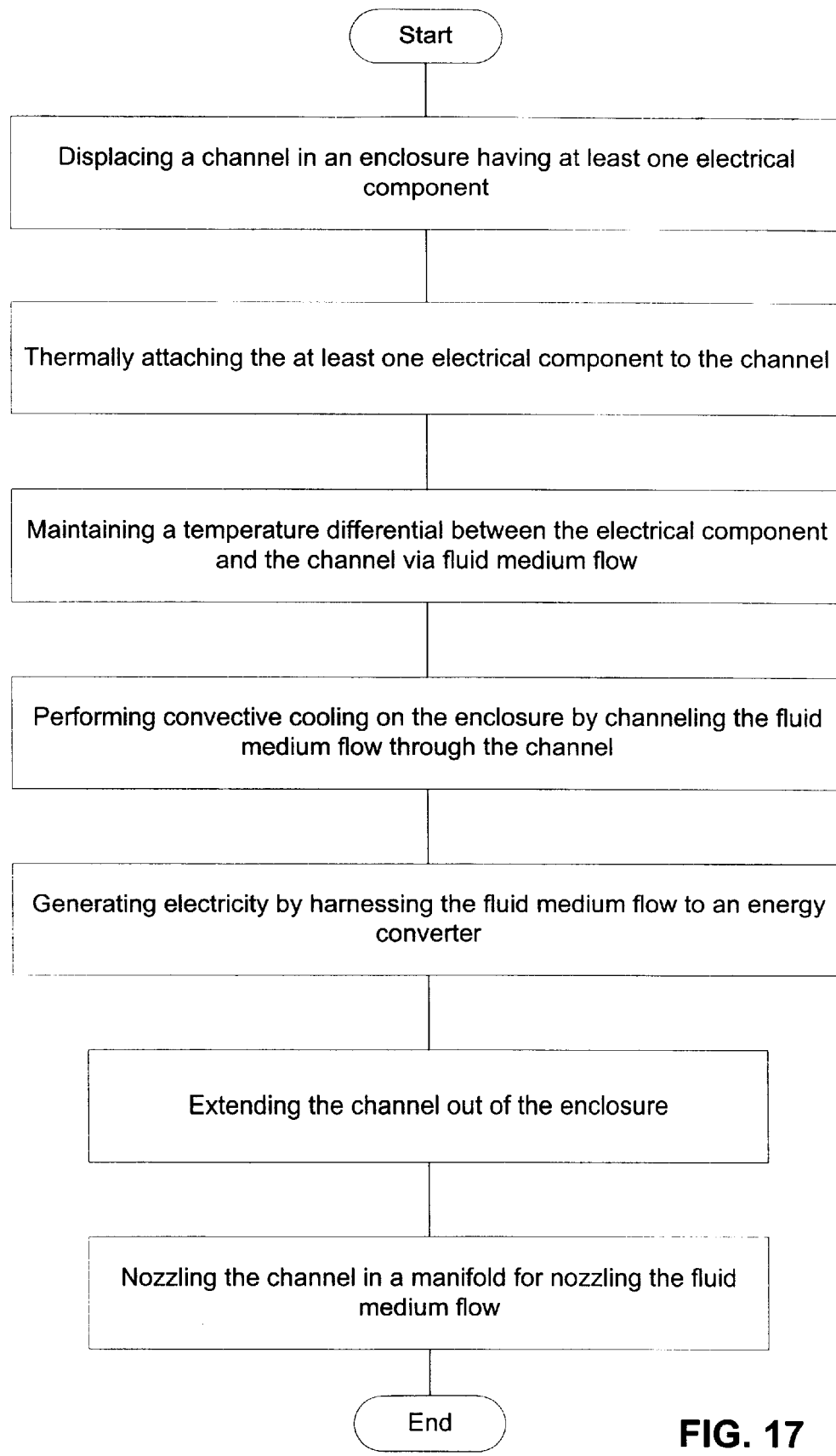
FIG. 17 is a flowchart depicting an exemplary process for dissipating heat and for generating energy from the dissipated heat.

In FIG. 17, a flowchart of an exemplary process for dissipating heat from an electrical component 22 to the ambient and for producing electricity from the dissipated heat is shown. In use, the present invention is directed to cool heat generating electrical components 22 without using an additional power source, e.g. a fan. The heat is conducted away from the electrical components 22 and into the interior of the channel 30. Inside the channel 30 the heat is transferred to the fluid medium 36 (air being just one example of such a medium) wherein the heated fluid medium 36 expands and causes a fluid flow between pressure differentials within the channel 30 by natural convection as the lower density of the flow of the fluid medium gives rise to a natural convection flow through the channel 30.

The channel 30 can be aerodynamically designed in a narrow form to concentrate the fluid medium 36 flow from the channel 30 through the interior of the enclosure 28. This fluid flow then can be harnessed to drive an energy converter 62 such as a generator.

While the flow resistance becomes slightly larger, this raises the local fluid medium velocity and increases the power generation of the turbines 64. The energy converter 62 connects to an electrical circuit which transfers the power derived from the turbine 64 to an external load. Additionally, the energy converter 62 connected to the turbines 64 can also be used to help start up motion of the turbine blade of the turbine 64.

Thus, the method provides displacing at least one channel 30 in the enclosure 28 wherein the enclosure 28 has at least one electrical component 22. Next, the channel 30 is thermally attached to the at least one electrical component 32. The method provides maintaining a temperature differential between the channel 30 and the at least one electrical component 22 via fluid medium flow. Convective cooling is performed on the enclosure 28 by channeling the fluid medium 36 through the channel 30.

The method may also provide generating electricity by harnessing the fluid medium flow to an energy converter 62.

Further, the method may provide nozzling the channel 30 in a manifold to nozzle the fluid medium flow. The method may also provide extending the channel 30 out of the enclosure 22.

Although the foregoing detailed description of the present invention has been described by reference to various embodiments, and the best mode contemplated for carrying out the prevention invention has been herein shown and described, it will be understood that modifications or variations in the structure and arrangement of these embodiments other than there specifically set forth herein may be achieved by those skilled in the art and that such modifications are to be considered as being within the overall scope of the present invention.

What is claimed is:

1. A heat dissipating device, comprising:
    a channel, the channel internally housed inside a enclosure wherein the channel is configured to extend across the enclosure;
    a fluid medium disposed within the channel; and
    a heat transfer member, the heat transfer member adjacently disposed to an electrical component wherein each electrical component is adapted to generate heat, the heat transfer member is positioned to thermally connect the electrical component to the channel wherein the heat transfer member is configured to conductably attach to the channel to maintain a temperature differential between the electrical component and the channel such that the fluid medium flows through the channel and out of the enclosure.

2. The heat dissipating device of claim 1, further comprising an energy converter, the energy converter having a turbine.

3. The heat dissipating device of claim 1, wherein the fluid medium is a gas that remains in a gaseous state at room temperature and room pressure.

4. The heat dissipating device of claim 3, wherein the gas is air.

5. The heat dissipating device of claim 1, wherein the heat transfer member is adapted to transfer heat at a temperature up to and including 150 degrees Celsius.

6. The heat dissipating device of claim 1, wherein the heat transfer member has a thermal conductor, the thermal conductor including a thermal conductive gel attached thereto.

7. The heat dissipating device of claim 6, wherein the thermal conductive gel is a silicon based aluminum powder to reduce contact resistance among the electrical component, the thermal conductor and the channel.

8. The heat dissipating device of claim 2, wherein the energy converter connects to an electrical storage.

9. The heat dissipating device of claim 1, wherein the channel has a nozzle section, the nozzle section is adapted to accelerate flow of the fluid medium to maximize convection flow therethrough.

10. The heat dissipating device of claim 9, wherein the turbine is mounted in the nozzle section for increased fluid medium flow.

11. A heat dissipating device to dissipate heat generated by electrical components, comprising:
    a plurality of channels, each channel internally disposed inside an enclosure wherein each channel is positioned to paralleably extend across the enclosure, each channel having an inlet to receive a fluid medium and an outlet to exit the fluid medium out of the enclosure;
    a plurality of heat transfer members, each heat transfer member adjacently disposed to an electrical component capable of generating heat therefrom, each heat transfer member thermally connecting each electrical component to the channel, the heat transfer member having a thermal conductor, the thermal conductor having a thermal conductive gel attached thereto to reduce contact resistance there between; and
    an extendable channel, the extendable channel removably fixed to the outlet to generate a longer length of the channel to increase flow of the fluid medium.

12. The heat dissipating device of claim 11, further comprising a manifold, wherein the manifold is configured to combine the flow of the fluid medium of the outlet and to dissipate the fluid medium out of the enclosure.

13. The heat dissipating device of claim 11, wherein the channel encompasses the electrical component wherein the electrical component is positioned to generate heat into the channel maintaining a temperature differential within the channel.

14. The heat dissipating device of claim 11, wherein each channel is configured in a upright form to paralleably extend from bottom to top of the enclosure.

15. The heat dissipating device of claim 11, wherein each channel is configured in a curved form to paralleably extend from side to side of the enclosure.

16. The heat dissipating device of claim 11, wherein each channel is configured in a nozzle form to paralleably extend from bottom to top of the enclosure.

17. The heat dissipating device of claim 11, wherein the channel comprises of polystyrene insulating material.

18. The heat dissipating device of claim 11, wherein an insulation layer surrounds the channel to further prevent heat loss from the channel.

19. The heat dissipating device of claim 18, wherein the insulation layer is coated with a metal plate.

20. The heat dissipating device of claim 11, wherein the extendable channel is adapted to manually extend out from the outlet.

21. The heat dissipating device of claim 11, wherein the extendable channel is adapted to automatically extend out from the outlet by an automatic means.

22. The heat dissipating device of claim 21, wherein the automatic means is controlled by a temperature sensor means.

23. The heat dissipating device of claim 11, further comprising an energy converter, the energy converter having a turbine, the turbine mounted at an exit of the extendable channel to generate electric power, the turbine being thermally driven by the flow of the fluid medium convected by the channel.

24. A heat dissipating device to dissipate by natural convection heat generated by electrical components, comprising:
    at least one common channel, the common channel being housed inside a enclosure, the common channel configured to encompass at least one circuit board wherein each circuit board has at least one electrical component, the electrical component adapted to generate heat into the common channel to maintain a temperature differential within the common channel;
    a manifold, the manifold adjacently disposed above each of the at least one common channel; and
    an extendable channel, the extendable channel removably fixed to the manifold to generate a longer length of the at least one channel.

25. The heat dissipating device of claim 24, further comprising an energy converter, the energy converter having a turbine, the turbine being mounted at an exit of the extendable channel to generate electric power.

26. The heat dissipating device of claim 24, wherein the extendable channel is adapted to manually extend out from the outlet.

27. The heat dissipating device of claim 24, wherein the extendable channel is adapted to automatically extend out from the outlet by an automatic means.

28. The heat dissipating device of claim 27, wherein the automatic means is controlled by a temperature sensor means.

29. A method of dissipating heat generated by electrical electrical components comprising the steps of:
   a. displacing a channel through a enclosure, the enclosure having at least one heat generating electrical component;
   b. thermally attaching the at least one heat generating electrical component to the channel;
   c. maintaining a temperature differential between the at least one heat generating electrical component and the channel wherein the temperature differential generates a heated fluid medium flow within the channel by creating a natural convection flow;
   d. performing convective cooling on the enclosure by channeling the heated fluid medium flow through the channel out of the enclosure; and
   e. generating electricity by harnessing the heated fluid medium flow to an energy converter.

30. The method according to claim 29, including the further step of extending the channel outside the enclosure for increased heated fluid medium flow.

31. The method according to claim 29, including the further step of paralleably aligning a plurality of channels in a path of least resistance within the enclosure and convecting heated fluid medium flow from the at least one heat generating electrical components.

32. The method according to claim 29, including the further step of nozzling the plurality of channels in a manifold for accelerating the heated fluid medium flow to the energy converter.

* * * * *